(12) United States Patent
Hoffman et al.

(10) Patent No.: US 7,427,776 B2
(45) Date of Patent: Sep. 23, 2008

(54) THIN-FILM TRANSISTOR AND METHODS

(75) Inventors: Randy Hoffman, Corvallis, OR (US);
Peter Mardilovich, Corvallis, OR (US);
Hai Chiang, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 352 days.

(21) Appl. No.: 10/961,507

(22) Filed: Oct. 7, 2004

(65) Prior Publication Data

US 2006/0079037 A1 Apr. 13, 2006

(51) Int. Cl.
*H01L 29/04* (2006.01)

(52) U.S. Cl. .................. 257/59; 257/72; 257/E21.387; 438/158; 438/151; 438/149

(58) Field of Classification Search .................. 257/40, 257/213, 43, 39, 59, 347
See application file for complete search history.

(56) References Cited

U.S. PATENT DOCUMENTS

| | | | |
|---|---|---|---|
| 3,442,647 A | 5/1969 | Hendrik | |
| 4,411,981 A | 10/1983 | Minezaki | |
| 4,425,572 A | 1/1984 | Takafuji | |
| 5,407,602 A | 4/1995 | Cava | |
| 5,744,864 A | 4/1998 | Cillessen | |
| 5,817,550 A | 10/1998 | Carey et al. | |
| 5,949,107 A | 9/1999 | Zhang | |
| 6,225,149 B1 | 5/2001 | Gan et al. | |
| 6,329,226 B1 | 12/2001 | Jones et al. | |
| 6,407,786 B1 | 6/2002 | Yamamoto et al. | |
| 6,486,009 B2 | 11/2002 | Yang et al. | |
| 6,597,015 B2 | 7/2003 | Yang et al. | |
| 6,614,052 B1 | 9/2003 | Zhang | |
| 6,642,085 B1 | 11/2003 | Wolfe et al. | |
| 6,677,191 B1 | 1/2004 | Battersby | |
| 6,707,513 B2 | 3/2004 | Tsujimura et al. | |
| 7,145,174 B2 * | 12/2006 | Chiang et al. | .................. 257/59 |
| 2002/0125437 A1 | 9/2002 | Izumi et al. | |
| 2003/0047785 A1 | 3/2003 | Kawasaki et al. | |
| 2003/0218222 A1 | 11/2003 | Wager, III et al. | |
| 2004/0016926 A1 | 1/2004 | Wolfe et al. | |
| 2004/0038446 A1 | 2/2004 | Takeda et al. | |
| 2004/0056273 A1 | 3/2004 | Nause et al. | |
| 2004/0077133 A1 | 4/2004 | Battersby | |
| 2004/0105041 A1 | 6/2004 | Tsujimura et al. | |
| 2004/0127038 A1 | 7/2004 | Carcia et al. | |
| 2004/0155846 A1 | 8/2004 | Hoffman | |
| 2004/0165121 A1 | 8/2004 | Tsujimura et al. | |
| 2005/0127354 A1 * | 6/2005 | Hanna et al. | .................. 257/40 |
| 2005/0173734 A1 | 8/2005 | Yoshioka | |

OTHER PUBLICATIONS

Nomura; "Thin-film Transistor Fabricated in Single-Crystalline Transparent . . . ", Science, American Assoc for the advancement of Science, vol. 300, May 23, 2003, pp. 1269-1272.

(Continued)

*Primary Examiner*—M. Wilczewski
*Assistant Examiner*—Tsz K Chiu

(57) ABSTRACT

A thin-film transistor (TFT) is fabricated by providing a substrate, depositing and patterning a metal gate, anodizing the patterned metal gate to form a gate dielectric on the metal gate, depositing and patterning a channel layer comprising a multi-cation oxide over at least a portion of the gate dielectric, and depositing and patterning a conductive source and conductive drain spaced apart from each other and disposed in contact with the channel layer.

70 Claims, 3 Drawing Sheets

OTHER PUBLICATIONS

Wager, "Transparent Electronics", Science, vol. 300, May 23, 2003, pp. 1245-1246.

Minami; "Transparent and Conductive Multicomponent Oxide Films . . . ", Journal of Vacuum Science & Tech A, vol. 17, No. 4, Jul. 1999, pp. 1765-1772.

Dehuff; "Transparent thin-film transistors with zinc indium oxide channel layer", Journal of Applied Physics, vol. 97, No. 6, Mar. 11, 2005, pp. 64505-1-64505-5.

F. Lemmi et al., "High-Performance TFTs Fabricated on Plastic Substrates," IEEE Electron Device Letters, V. 25 No. 7 (Jul. 2004), pp. 486-488.

S. H. Won et al, "Hydrogenated Amorphous Silicon Thin-Film Transistor on Plastic With An Organic Gate Insulator," IEEE Electron Device Letters, V. 25 No. 3 (Mar. 2004), pp. 132-134.

X. Duan et al., "High-performance thin-film transistors using semiconductor nanowires and nanoribbons," Nature, V. 425 (Sep. 18, 2003), pp. 274-278.

E. Fortunato (CENIMAT, Portugal), "Invisible Electronics: Thin Film Transistors based on Nanocrystalline ZnO" in "State of the Art in the amorphous and nanocrystalline research" date unknown [website of 21st International Conference on Amorphous and Nanocrystalline Semiconductors (ICANS 21) scheduled for Sep. 4-9, 2005 in Lisbon, Portugal]: http://eventos.fct.unl.pt/ICANS21/mainpage/state_doc/Invisible%20Bectronics_fortunato.pdf.

FengYuan Gan et al., "Thin film transistors wit anodic gate dielectrics and chemical bath deposited active layers," Journal of Vacuum Science and Technology, vol. 20/4 (Jul. 2002), pp. 1365-1368.

H-C. Lin et al. "A Novel Thin-Film Transistor with Self-Aligned Field Induced Drain," IEEE Electron Device Letters, V. 22 No. 1 (Jan. 2001), pp. 26-28.

T. Arai et al., "Aluminium-based gate structure for active-matrix liquid crystal displays," IBM J. Research and Development, vol. 42 Nos. 3/4 (1998) pp. 491-500.

S. D. Theiss et al. "Polysilicon Thin Film Transistors Fabricated at 100° C. on a Flexible Plastic Substrate ," International Electron Devices Meeting (IEDM) (1998), pp. 257-260 (10.3.1-10.3.4).

Fang-Chen Luo, "TFT fabrication by anodization or plasma oxidation," Xerox Disclosure Journal, vol. 9, No. 4 (Jul./Aug. 1984) p. 233-23.

Author unknown, Lawrence Livermore National Laboratories IPAC, "Silicon Transistor Fabrication on Plastic Substrates," Nov. 2001 (downloaded Sep. 30, 2004): http://www.llnl.gov/IPandC/technology/profile/chemistrymaterial/SiliconTransistorFabrication/index.php.

\* cited by examiner

THIN-FILM TRANSISTOR AND METHODS

TECHNICAL FIELD

This invention relates generally to thin-film transistors and methods for their fabrication.

BACKGROUND

The ability to form electronic circuits on low-cost substrate materials (e.g., "plastics") allows a substantial cost reduction, as compared to processes using more expensive substrates, such as silicon or electronic-grade glass. In order to obtain such a cost-reduction advantage, it is desirable to realize high-performance electronic devices (e.g., transistors), using processes with the low-cost substrate materials. A typical example of an application benefiting from such high-performance devices is a backplane for a display.

Typically, candidate low-cost substrate materials (e.g., organics and inexpensive glass) are also quite temperature-sensitive. Thus, it is necessary that high performance electronic devices be fabricated using processes that do not expose the substrate material to high temperatures. Typically, it is desirable to use processing temperatures that do not exceed the range of about 100° C. to about 300° C. Lower temperatures typically enable the use of lower-cost substrate materials. As an example, various organic semiconductors and dielectrics can be used to build transistors at quite low temperatures, compatible with low-temperature inexpensive substrate materials. Furthermore, organic semiconductors generally exhibit good mechanical flexibility, important for integration with flexible substrate materials. However, due to intrinsic material limitations, organic semiconductors in general show quite low mobilities (e.g., about 1 $cm^2$/Volt-sec or even much lower), which reduce their applicability to high-performance, large-area applications such as displays. Low mobility similarly limits applicability of amorphous silicon. While organic thin-film transistors (TFT's) may in some instances be suitable for pixel-switching elements (e.g., for bi-stable display technologies), they are generally not suitable for on-glass drivers or other processing circuitry, which can be integrated to further decrease overall display cost. Plastic substrates, besides having lower costs than other substrates, also provide benefits of flexibility, shock resistance, and light weight.

Another approach involves the use of more conventional inorganic semiconductors, such as silicon, which require high processing temperatures. High-temperature processes are carried out prior to a transfer step in which processed semiconductor nanowires, nanoribbons, or other such structures are transferred to the low-cost substrate material. For example, in the paper "High-performance thin-film transistors using semiconductor nanowires and nanoribbons," Nature, v. 425, (18 Sep. 2003) pp. 274-278, X. Duan et al. have reported mobilities above 100 $cm^2$/Volt-sec for silicon nanowire TFT's on plastic, using such an approach. While such an approach enables high mobilities and excellent performance, process complexity is increased, depending on the nature of the transfer process, so that the substrate-related cost reduction may be counteracted to some degree by costs associated with added process complexity.

It is also possible to directly deposit and process certain inorganic semiconductors on low-temperature substrate materials. Amorphous silicon TFT's can be directly processed at temperatures compatible with "plastic" substrate materials. For example, mobilities of about 0.4 $cm^2$/Volt-sec have been reported with a maximum processing temperature of about 180° C. (S. H. Won et al., IEEE Electron Device Letters, v. 25, n. 3, (March 2004), pp. 132-134). Amorphous silicon, however, has similar mobility limitations and associated limited applicability as described above for organic TFT's. Polycrystalline silicon TFT's can also be directly processed on "plastic", using laser crystallization; for example, mobilities of about 65 $cm^2$/Volt-sec have been reported with maximum processing temperature of 320° C. (F. Lemmi et al., IEEE Electron Device Letters, v. 25, n. 7, (July 2004), pp. 486-488).

Previously, a mobility of 60 $cm^2$/Volt-sec for polysilicon TFT's had been reported with a maximum processing temperature of 150° C., also using laser crystallization: S. D. Theiss et al., "Polysilicon Thin Film Transistors Fabricated at 100° C. on a Flexible Plastic Substrate," IEDM Technical Digest (1998), pp. 257-260. Potential drawbacks for such approaches are added cost and complexity associated with laser crystallization.

While all of these prior methods have resulted in useful devices, additional thin-film devices and methods for their fabrication are needed limitations of low performance, process complexity, and/or processing temperature.

BRIEF DESCRIPTION OF THE DRAWINGS

The features and advantages of the disclosure will readily be appreciated by persons skilled in the art from the following detailed description when read in conjunction with the drawings, wherein.

DETAILED DESCRIPTION OF EMBODIMENTS

Figure 1:
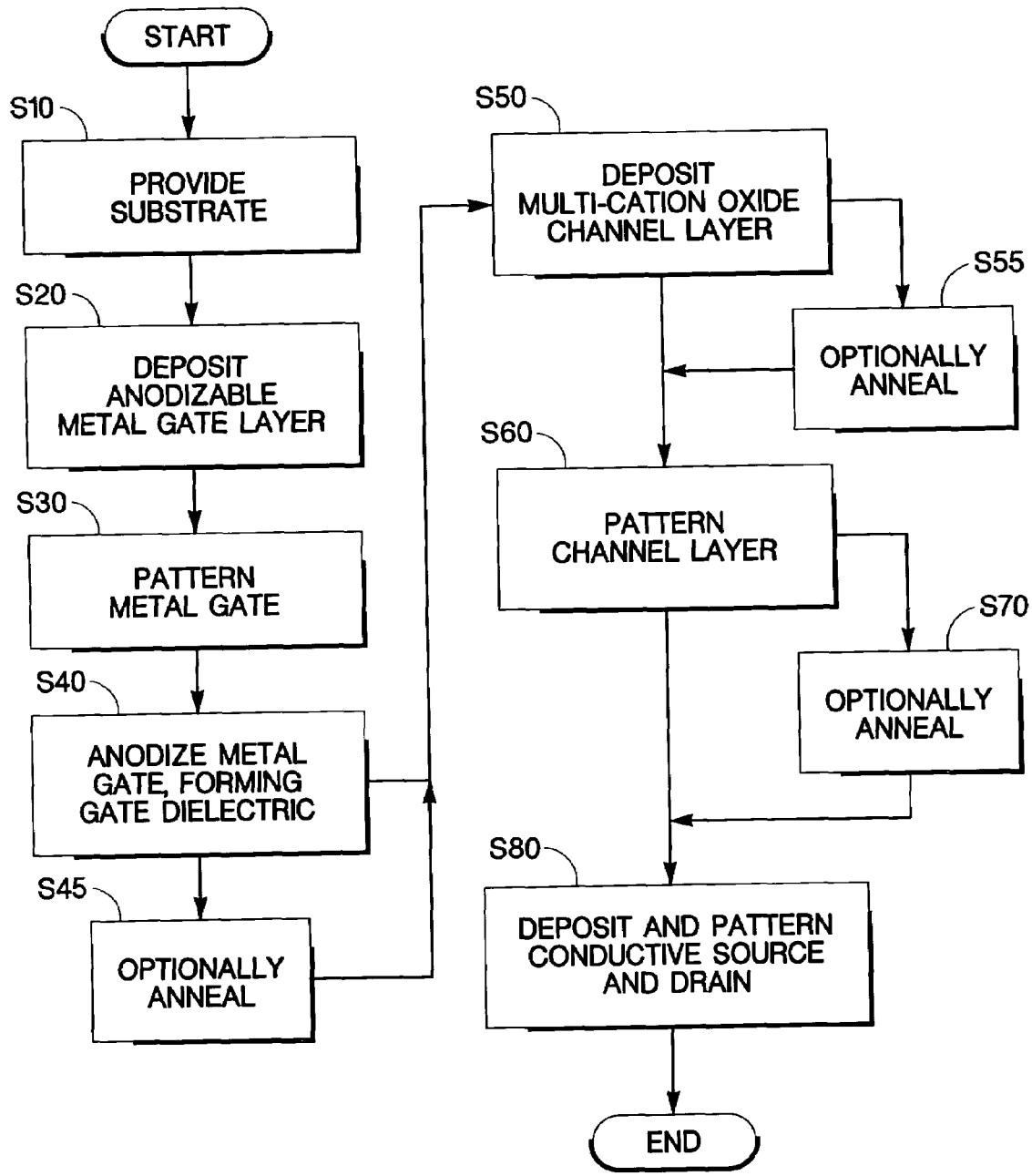
FIG. 1 is a flowchart of an embodiment of a method for fabricating thin-film transistors.

For clarity of the description, the drawings are not drawn to a uniform scale. In particular, vertical and horizontal scales may differ from each other and may vary from one drawing to another. In this regard, directional terminology, such as "top," "bottom," "front," "back," "leading," "trailing," etc., is used with reference to the orientation of the drawing figure(s) being described. Because components of the invention can be positioned in a number of different orientations, the directional terminology is used for purposes of illustration and is in no way limiting.

References to the periodic table of elements are based on the periodic table as recommended by the International Union of Pure and Applied Chemistry (IUPAC). The latest version of that periodic table is available on the Internet at http://www.iupac.org/reports/periodic_table/.

One aspect of the invention provides embodiments of a thin-film transistor (TFT) 10, fabricated by providing a substrate, depositing and patterning a metal gate, anodizing the patterned metal gate to form a gate dielectric on the metal gate, depositing and patterning a channel layer comprising a multi-cation oxide, and depositing and patterning a conductive source and conductive drain.

Another aspect of the invention includes methods for fabricating a thin-film transistor (TFT). FIG. 1 is a flowchart of an embodiment of a method for fabricating thin-film transistors. Steps of the method embodiment are denoted by reference numerals S10, S20, . . . , S80. These reference numerals do not imply that the steps should be performed in any particular order such as numerical order. However, the steps may be performed in the order recited. Optional paths are also indicated by arrows in the flowchart of FIG. 1.

An embodiment of such a method for fabricating a thin-film transistor (TFT) includes the steps of providing a substrate, depositing and patterning a metal gate that is able to be anodized, anodizing the patterned metal gate to form a gate dielectric on the metal gate, depositing and patterning a channel layer comprising a multi-cation oxide, and depositing and patterning a conductive source and conductive drain. The methods can also include various combinations of optional annealing steps after forming the gate dielectric on the metal gate, after depositing the multi-cation oxide for the channel layer, or after patterning the channel layer. Details of various embodiments of such methods are described in detail below.

In these method embodiments, the steps may generally be performed at temperatures equal to or less than about 400° C. if the required properties of the particular substrate material employed do not change significantly at such temperatures. All the materials used in the embodiments described herein may be processed at 400° C. for at least short-term exposures. However, it is not generally necessary to use temperatures as high as 400° C. As will be seen from the examples described hereinbelow, a suitable range of temperatures at which to perform the steps includes temperatures equal to or less than about 125° C.

In step S10, a substrate is provided. It may be a flexible substrate and/or a substantially transparent substrate. A suitable substrate for many applications is a polyimide film. An example of such a film is Kapton® HN, available from DuPont High Performance Films of Circleville, Ohio (a division of E.I. du Pont de Nemours and Company of Wilmington, Del.). Additionally, in at least one embodiment in which a base substrate material comprises one or more metals, an insulator layer such as polyimide may be utilized as an overcoating on the metal base. Thus, for some applications, the substrate may be a composite material, such as a layer of polyimide coated on a stainless steel base, for example. Other suitable substrate materials include, for example, rigid substrates such as silicon, silicon dioxide (quartz), aluminum oxide (e.g., sapphire), or one or more types of glass; and flexible substrates, including stainless steel and/or metal foils and one or more organic substrate materials, such as acrylics, polyethylene terephthalate (PET), polyethersulfone (PES), polycarbonate (PC), polyethylenenaphthalate (PEN), or poly (methyl methacrylate) (PMMA). Another example of a suitable composite substrate has a layer of polyimide on an acrylate base.

In step S20, an anodizable metal layer is deposited. The anodizable metal layer may comprise aluminum, tantalum, titanium, tungsten, or alloys of those metals, for example, or any other anodizable metal, providing that the oxide film resulting from anodization of said metal exhibits suitable properties to serve as a thin-film transistor gate dielectric. The thickness is generally not critical provided the sheet resistivity is low enough and the metal is a continuous film, coating any surface defects of the substrate, and that there is sufficient excess metal to allow for partial consumption (oxidation) of the metal film during the anodization process. A suitable thickness of aluminum, for example, is 200 nanometers to 500 nanometers on a sufficiently smooth defect-free substrate. In step S30, the anodizable metal layer is patterned to form a metal gate. Patterning the metal gate may be performed by any of the conventional photolithographic methods, for example.

In step S40, the metal gate is anodized, forming a gate dielectric on the metal gate. Anodization is a well-known process of forming an oxide layer on a metal by making the metal the anode in an electrolytic cell and passing an electric current through the cell. For aluminum, for example, current density during anodization should typically be kept below about 0.5 milliamperes/cm$^2$. For anodization, the cell may contain an aqueous solution of an acid, such as citric, boric, tartaric, sulfuric, chromic, or oxalic acid. Aluminum and tantalum are metals commonly anodized in such an anodization process. Tungsten and titanium may also be anodized, as may other metals. Optionally, an annealing step S45 may be performed after the anodization step S40. Annealing step S45 may consist of drying the partially completed structure, including the anodized gate.

In step S50, a multi-cation oxide layer is deposited. It is believed that a multi-cation oxide provides a channel material that remains amorphous throughout the range of temperatures encountered in processing and use. However, the invention should not be construed as being limited to the consequences of any particular theory of operation.

Many multi-cation oxides may be used, such as a mixed oxide of two or more cations of the groups 11, 12 13, 14, and 15 (IUPAC) of the periodic table. Those skilled in the art will recognize that, depending on the particular properties required for an application, a particular multi-cation oxide may be selected from among these by following the methods and tests employed in the examples described hereinbelow and illustrated by FIGS. 4-7. The multi-cation oxide thus selected may be a mixed oxide including two or more cations selected from copper, silver, lead, germanium, antimony, gallium, cadmium, zinc, indium, and tin, for example. In particular, a mixed oxide of two or more cations selected from among gallium, cadmium, zinc, indium, and tin may be selected as the multi-cation oxide. In order to illustrate the invention with concrete examples of embodiments, methods and structures using zinc-indium oxide as the multi-cation oxide are described in the examples below. In these various embodiments, the channel can be formed from a ternary material containing zinc, indium, and oxygen to form zinc-indium oxide (e.g., $Zn_xIn_{2y}O_{x+3y}$). In the various embodiments, these materials can include various morphologies depending on composition, processing conditions, and other factors. Similarly, other multi-cation oxides as listed above may be used in place of the zinc-indium oxide used in the following exemplary embodiments.

For an embodiment using zinc-indium oxide as the multi-cation oxide, the atomic ratio of zinc to indium may be between about 1:1 and about 1:8, for example. In other particular embodiments, an atomic ratio of zinc to indium may be in the range between about 1:2 and about 1:6. A suitable alternative embodiment has an atomic ratio of zinc to indium of about 1:4 (corresponding to a mol ratio of $ZnO:In_2O_3$ of about 1:2). Expressing the composition in terms of mol ratio in this manner is not intended to imply that $ZnO$ and $In_2O_3$ are present as distinct phases in the multi-cation oxide layer.

In step S50, the multi-cation oxide layer may be deposited by sputtering the multi-cation oxide over at least a portion of the gate dielectric. The sputtering may be done by sputtering from a single target comprising the multi-cation oxide, such as a target composed of zinc-indium oxide, or by reactively sputtering (i.e., sputtering in an oxygen-containing atmosphere) from a single metallic target comprising an alloy of the desired metals, for example. Alternatively, the sputtering may be done by co-sputtering from two or more targets comprising oxides of different cations, such as a target composed of zinc oxide and a target composed of indium oxide, or by reactively sputtering from two or more metallic targets, for example. To conform with the temperature ranges discussed above, the sputtering may performed at temperatures equal to or less than about 400° C. and in some cases temperatures equal to or less than about 125° C. Optionally, an annealing step S55 may be performed after the deposition step S50, subject to the same temperature considerations as the other steps.

In step S60, the channel layer of multi-cation oxide is patterned. Again, the patterning may be performed by any of the conventional photolithographic methods or other techniques such as ion milling or laser ablation. Optionally, an annealing step S70 may be performed after the patterning step S60, subject to the same temperature considerations as the other steps.

In step S80, a conductive source and conductive drain are deposited and patterned. This step may be done by depositing and patterning indium-tin oxide (ITO), for example. The ITO may be deposited to a thickness of about 50 to 300 nanometers, for example and patterned by conventional photolithography. Other suitable source and drain materials include doped oxide semiconductors, such as n-type doped zinc oxide, indium oxide, and/or tin oxide, and/or metals, such as Al, Ag, In, Sn, Zn, Ti, Mo, Au, Pd, Pt, Cu, Ni, and W.

Another aspect of the invention is a method of using a multi-cation oxide as a channel material in a thin-film transistor: a substrate is provided, a metal gate is deposited and patterned, a gate dielectric is formed on the metal gate, and the multi-cation oxide is deposited and patterned to form a channel layer for a thin-film transistor. A conductive source and conductive drain for the thin-film transistor are both deposited and patterned, whereby a thin-film transistor using the multi-cation oxide is fabricated.

Those skilled in the art may more clearly understand the methods of the present invention in terms of a specific example. An exemplary method for fabricating a thin-film transistor (TFT) using zinc-indium oxide as the multi-cation-oxide channel material on a flexible substrate comprises steps of: providing the flexible substrate, depositing a metal film adapted to be anodized on the flexible substrate, patterning the metal film to form a metal gate, anodizing the patterned metal gate to form a gate dielectric on the metal gate, optionally annealing, depositing a channel layer comprising zinc-indium oxide, optionally annealing, patterning the channel layer, optionally annealing, depositing and patterning a conductive source and conductive drain comprising indium-tin oxide (ITO), depositing and patterning conductive contact pads electrically coupled to the metal gate, the conductive source, and the conductive drain respectively.

Generally, it is not necessary to anneal at every time an optional anneal is indicated in this exemplary method. For example, an annealing step only after depositing and patterning the zinc-indium oxide channel layer may be sufficient. As mentioned above, the annealing step after anodizing the patterned metal gate may comprise drying the partially completed structure, including the anodized gate. This annealing step may further comprise removing residual organics, incorporated during anodization, from the gate dielectric film.

Figure 2:
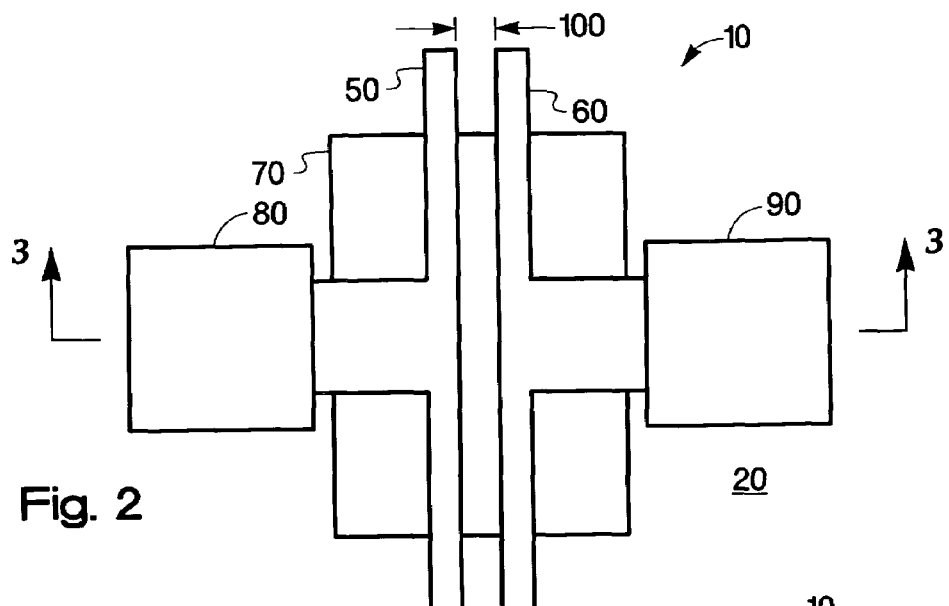
FIG. 2 is a top plan view of an embodiment of a thin-film transistor.
Figure 3:
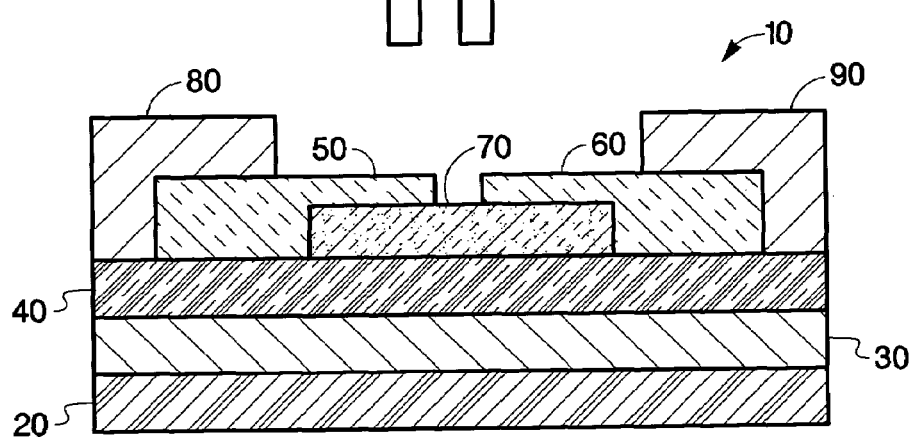
FIG. 3 is a cross-sectional side elevation view of an embodiment of a thin-film transistor.

Thus, another aspect of the invention provides embodiments of a thin-film transistor (TFT) 10 formed on a substrate by the methods described above. FIG. 2 is a top plan view and FIG. 3 is a cross-sectional side elevation view of an embodiment of a thin-film transistor made by these methods. As shown in FIGS. 2 and 3, the thin-film transistor includes a metallic gate 30 disposed on the substrate 20, a gate dielectric 40 formed by anodization of the metallic gate 30 and at least partially covering the metallic gate 30. As shown in FIGS. 2 and 3, the thin-film transistor further includes a channel 70 comprising a multi-cation oxide material disposed on at least a portion of the gate dielectric 40, a conductive source 50, and a conductive drain 60 spaced apart from each other, both of the latter contiguous with the channel 70. The channel width is defined generally by the spacing 100 between source 50 and drain 60. Conductive contact pads 80 and 90 may be electrically coupled to source 50 and drain 60 respectively. A third conductive contact pad (not shown) may be electrically coupled to metal gate 30 (out of the plane of the cross-section of FIG. 3). Those skilled in the art will recognize that these contact pads may be provided for convenience of testing, for example, but are not normally required for every device when a number of TFT's are combined in an integrated circuit.

From the process descriptions hereinabove, it will be apparent that substrate 20 may be a flexible film such as a polyimide film and/or may be substantially transparent. The multi-cation oxide of channel 70 comprises a mixed oxide of two or more cations of the groups 11, 12, 13, 14, and 15 of the periodic table, for example, a mixed oxide including two or more cations selected from copper, silver, lead, germanium, antimony, gallium, cadmium, zinc, indium, and tin. The multi-cation oxide may be amorphous. Specifically the multi-cation oxide may be a mixed oxide of cations selected from the list consisting of gallium, cadmium, zinc, indium, and tin, such as zinc-indium oxide. Such a zinc-indium oxide channel material may have an atomic ratio of zinc to indium between about 1:1 and about 1:8, or more narrowly defined, an atomic ratio of zinc to indium between about 1:2 and about 1:6. An atomic ratio of about 1:4 is suitable. This atomic composition does not take into consideration the presence of oxygen and the optional presence of other elements. It is merely a representation of the relative ratio of zinc and indium. The metallic gate comprises an anodizable metal such as aluminum, tantalum, titanium, tungsten, or their alloys. The gate dielectric comprises an oxide of an anodizable metal, such as aluminum oxide, tantalum oxide, titanium oxide, tungsten oxide, or combinations of those oxides. As mentioned above, the conductive source or drain or both may comprise indium-tin oxide (ITO), which may be substantially transparent.

Figure 4:
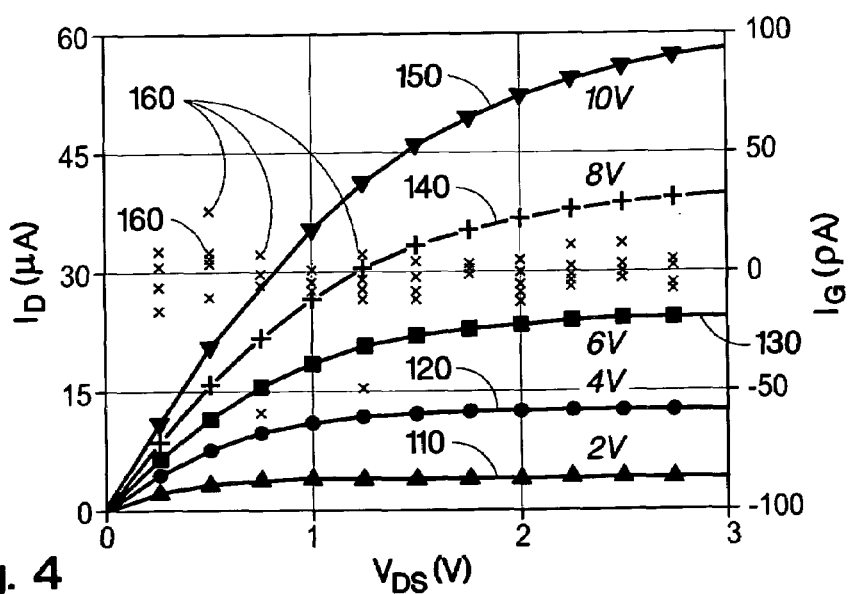
FIG. 4 is a graph showing drain current and gate current vs. drain voltage for an embodiment of a thin-film transistor.
Figure 5:
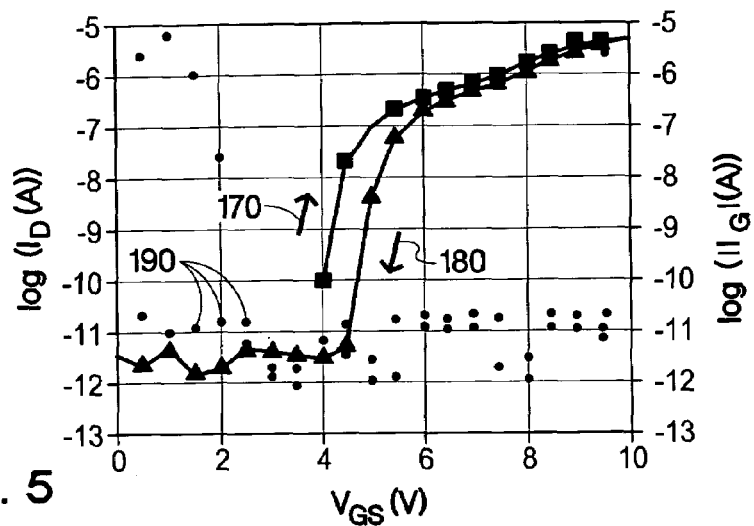
FIG. 5 is a graph showing drain current and gate current on a logarithmic scale vs. gate voltage for an embodiment of a thin-film transistor.
Figure 6:
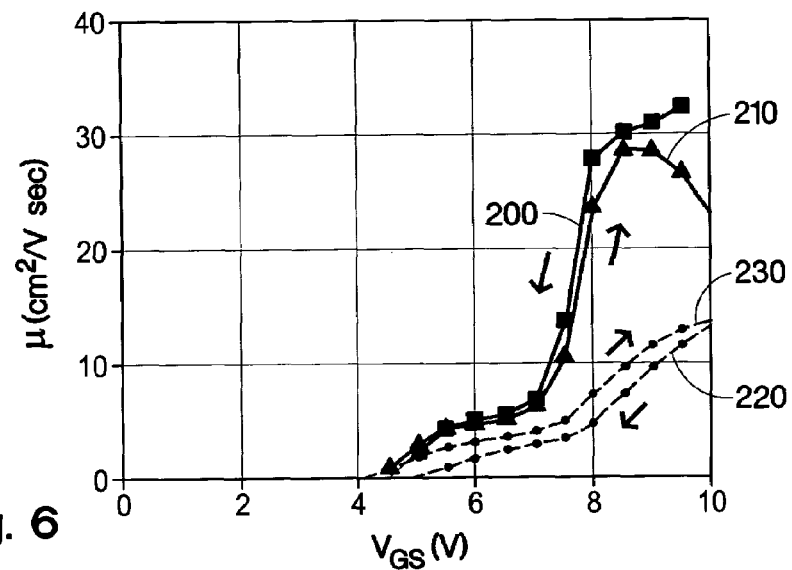
FIG. 6 is a graph showing mobility vs. gate voltage for an embodiment of a thin-film transistor.

FIGS. 4, 5, and 6 show results obtained from tests on TFT's made with aluminum gates, aluminum oxide gate dielectrics formed by anodization, and zinc-indium oxide channels. In the embodiments illustrated by FIGS. 4, 5, and 6, the zinc-indium oxide stoichiometry was 1:4 Zn:In (atomic ratio). Each of these TFT's includes a metallic aluminum gate disposed on a substrate, an aluminum oxide gate dielectric formed by anodization of the metallic aluminum gate and covering the metallic aluminum gate, a channel comprising zinc-indium oxide (disposed on at least a portion of the aluminum oxide gate dielectric), and a conductive source and conductive drain of indium-tin oxide (ITO) spaced apart from each other, both of the latter disposed contiguous with the channel. The conductive metal gate performs the function of modulating the concentration of conduction electrons in the channel. The dielectric formed by anodization of the gate covers and insulates the gate. The multi-cation-oxide channel has the function of controllably conducting current carriers.

The source and drain, spaced apart from each other, function to inject and collect current carriers in the channel, with which they are contiguous.

Thus, methods performed in accordance with the present invention have been used to fabricate TFT's on a flexible "plastic" (Kapton® HN) substrate material, with a maximum processing temperature of 125° C., with excellent results. Excellent perfomance parameters have been measured in these TFT's: mobility of about 25 cm$^2$/Volt-sec and higher, drain-current on-to-off ratio greater than 10$^7$, gate-leakage current less than 10 nA/cm$^2$, and gate-dielectric breakdown field greater than 3 megavolts/cm, for example. Additional exemplary electrical characteristics are described in detail below for TFT's using zinc-indium oxide channel layers that have various stoichiometries (ZnO:In$_2$O$_3$ mol ratios) and various annealing temperatures, showing that high mobilities are attainable for quite low anneal temperatures, in particular for a (ZnO:In$_2$O$_3$) stoichiometry of 1:2 (mol ratio). The atomic ratio of zinc to indium in the latter stoichiometry is 1:4.

In order to fabricate alumina with quality sufficient to deliver the TFT performance described above as a gate dielectric formed by anodizing aluminum, various parameters were varied, such as the following: aluminum layer thickness (from about 200 to 500 nanometers), current density (from 0.4 to 5 mA/cm$^2$), stepped voltage increase (steps from 1 to 10 V), final anodization voltage (from 35 to 100 V), duration of a potentiostatic regime, and post-processing annealing/drying (from room temperature to 125° C.).

FIGS. 4, 5, and 6 show results obtained from tests on TFT's made on flexible Kapton® substrates with aluminum gates, aluminum oxide gate dielectrics formed by anodization, and zinc-indium oxide channels.

FIG. 4 is a graph showing drain current I$_D$ in microamperes (left ordinate scale) and gate leakage current I$_G$ in picoamperes (right ordinate scale) vs. drain-to-source voltage V$_{DS}$ in volts (abscissa scale) for an embodiment of a thin-film transistor. Curves 110, 120, 130, 140, and 150 show drain currents I$_D$ vs. drain-to-source voltage V$_{DS}$ for gate-to-source voltages (V$_{GS}$) of 2V, 4V, 6V, 8V, and 10V respectively. Saturation occurs in the I$_D$-V$_{DS}$ curves, and full channel turnoff occurs at V$_{GS}$=0 V. The points 160, indicating values of gate leakage current I$_G$, show gate leakage generally less than 7 nanoamperes/cm$^2$. Such excellent functional behavior may be characterized as ideal for TFT function.

FIG. 5 is a graph showing drain current ID in amperes (logarithmic left ordinate scale) and gate current I$_G$ in amperes (logarithmic right ordinate scale) vs. gate-to-source voltage V$_{GS}$ in volts (abscissa scale) for an embodiment of a thin-film transistor. Curves 170 and 180 show results for forward sweep and reverse sweep of V$_{GS}$, as indicated by arrows showing direction of data progression, with V$_{DS}$ held at 0.1 V. There is a significant hysteresis. The device turn-on voltage, V$_{on}$, (the gate voltage at which drain current I$_D$ begins to increase with increasing gate voltage V$_{GS}$) is shifted in a positive direction by nearly one volt from the forward to the reverse sweep. Points 190 show absolute values of gate current I$_G$ in amperes on the logarithmic right ordinate scale.

FIG. 6 is a graph showing incremental mobility $\mu_{inc}$ and average mobility $\mu_{avg}$ in cm$^2$/Volt-sec (both calculated from the data of FIG. 5) vs. gate-to-source voltage V$_{GS}$ in volts for an embodiment of a thin-film transistor. The hysteresis shown in FIG. 5 is also evident in FIG. 6, where the arrows again indicate direction of data progression. The first mobility, $\mu_{inc}$, shown by curves 200 and 210, characterizes the mobility of a differential quantity of charge as it is incrementally added to the net channel charge due to a differential increase in gate voltage V$_{GS}$. The second mobility, $\mu_{avg}$, shown by curves 220 and 230, characterizes the average mobility of the cumulative induced channel charge. FIG. 6 shows that these TFT's attain excellent mobility values.

Figure 7:
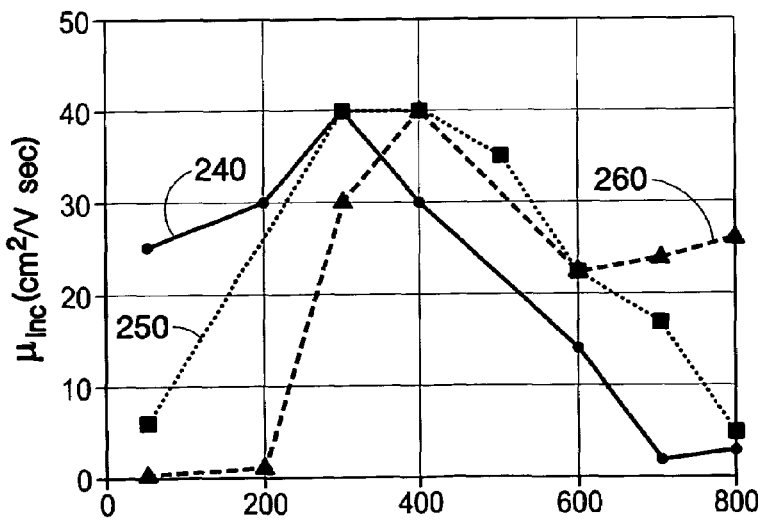
FIG. 7 is a graph showing mobility vs. annealing temperature for various embodiments of thin-film transistors made with various channel compositions.

FIG. 7 is a graph showing incremental mobility $\mu_{inc}$ in cm$^2$/Volt-sec vs. annealing temperature in ° C. for various embodiments of thin-film transistors made with various channel compositions. Curve 240 shows incremental mobility for a channel with stoichiometry characterized by mol ratio 1:2 of ZnO:In$_2$O$_3$ (atomic ratio of Zn:In=1:4). Curve 250 shows incremental mobility for a channel with stoichiometry characterized by mol ratio 1:1 of ZnO:In$_2$O$_3$ (atomic ratio of Zn:In=1:2). Curve 260 shows incremental mobility for a channel with stoichiometry characterized by mol ratio 2:1 of ZnO:In$_2$O$_3$ (atomic ratio of Zn:In=1:1). All of the compositions were capable of high mobilities at a suitable annealing temperature. The low annealing temperatures required are advantageous for these TFT devices.

INDUSTRIAL APPLICABILITY

Thin-film transistors made by any of the method embodiments described herein may be used in any application enhanced by a low-cost and/or flexible substrate (e.g., in wearable and/or disposable electronic devices) and in applications where the substrate is advantageously adapted to fit the shape of its immediate environment. TFT's made in accordance with the present invention may be used in an integrated circuit, for example. TFT's made on a transparent substrate material are especially useful when applied in a display.

Although the foregoing has been a description and illustration of specific embodiments of the invention, various modifications and changes thereto can be made by persons skilled in the art without departing from the scope and spirit of the invention as defined by the following claims. For example, the order of steps may be varied, and functionally equivalent materials may be substituted for those used in the particular embodiments described herein. A flexible substrate may be bent or otherwise deformed to fit the application (after forming the TFT, for example). Also, doping of one or more of the layers (e.g., the channel layer 70 illustrated in FIGS. 2 and 3) may also be accomplished by the introduction of oxygen vacancies and/or by substitution of aliovalent elements such as Sn, Al, Ge, and Ga.

What is claimed is:

1. A method for fabricating a thin-film transistor (TFT), comprising the steps of:
   a) providing a substrate,
   b) depositing and patterning a metal gate adapted to be anodized,
   c) anodizing the patterned metal gate to form a gate dielectric on the metal gate,
   d) depositing and patterning a channel layer comprising a multi-cation oxide inorganic material over at least a portion of the gate dielectric, and
   e) depositing and patterning a conductive source and conductive drain spaced apart from each other and disposed in contact with the channel layer.

2. The method of claim 1, further comprising the step of annealing after forming a gate dielectric on the metal gate.

3. The method of claim 1, further comprising the step of annealing after depositing the channel layer comprising a multi-cation oxide.

4. The method of claim 1, further comprising the step of annealing after patteming the channel layer comprising a multi-cation oxide.

5. The method of claim 1, wherein the substrate provided is flexible.

6. The method of claim 1, wherein the substrate provided is substantially transparent.

7. The method of claim 1, wherein the substrate provided comprises a polyimide.

8. The method of claim 1, wherein the steps are performed at temperatures equal to or less than about 400 degrees C.

9. The method of claim 1, wherein the steps are performed at temperatures equal to or less than about 125 degrees C.

10. The method of claim 1, wherein the steps are performed in the order recited.

11. The method of claim 1, wherein the multi-cation oxide comprises a mixed oxide of two or more cations of groups 11, 12, 13, 14, and 15 of the periodic table.

12. The method of claim 1, wherein the multi-cation oxide comprises a mixed oxide including two or more cations selected from the list consisting of copper, silver, lead, germanium, antimony, gallium, cadmium, zinc, indium, and tin.

13. The method of claim 1, wherein the muiti-cation oxide comprises a mixed oxide including two or more cations selected from the list consisting of gallium, cadmium, zinc, indium, and tin.

14. The method of claim 1, wherein the multi-cation oxide comprises zinc-indium oxide.

15. The method of claim 14, wherein the zinc-indium oxide has an atomic ratio of zinc to indium between about 1:1 and about 1:8.

16. The method of claim 14, wherein the zinc-indium oxide has an atomic ratio of zinc to indium between about 1:2 and about 1:6.

17. The method of claim 14, wherein the zinc-indium oxide has an atomic ratio of zinc to indium of about 1:4.

18. The method of claim 1, wherein the multi-cation oxide is amorphous.

19. The method of claim 1, wherein step b) of depositing and patterning a metal gate adapted to be anodized comprises depositing a metal selected from the list consisting of aluminum, tantalum, titanium, tungsten, and alloys thereof.

20. The method of claim 1, wherein step b) of depositing and patterning a metal gate adapted to be anodized comprises depositing a metal selected tram the list consisting of aluminum, tantalum, and alloys thereof.

21. The method of claim 1, wherein step b) of depositing and patterning a metal gate adapted to be anodized comprises depositing aluminum.

22. The method of claim 1, wherein the step d) of depositing and patterning a channel layer comprising a multi-cation oxide includes sputtering the multi-cation oxide over at least a portion of the gate dielectric.

23. The method of claim 22, wherein the sputtering is performed at temperatures equal to or less than about 400 degrees C.

24. The method of claim 22, wherein the sputtering is performed at temperatures equal to or less than about 125 degrees C.

25. The method of claim 22, wherein the multi-cation oxide comprises zinc-indium oxide.

26. The method of claim 22. wherein the sputtering is performed by sputtering from a target comprising the multi-cation oxide.

27. The method of claim 22, wherein the sputtering is performed by reactively sputtering from a metallic target comprising an alloy of the selected metal catians.

28. The method of claim 22, wherein the sputtering is performed by co-sputtering from two or more targets comprising oxides of different cations.

29. The method of claim 22, wherein the sputtering is performed by reactively co-sputtering from two or more metallic targets comprising different metal cations.

30. The method of claim 1, wherein step e) of depositing and patterning a conductive source and conductive drain comprises depositing and patterning indium-tin oxide (ITO).

31. A method for fabricating a thin-film transistor (TFT), comprising the steps of:
   a) providing a flexible substrate,
   b) depositing on the flexible substrate a metal film adapted to be anodized and patterning a metal gate,
   c) anodizing the patterned metal gate to form a gate dielectric on the metal gate,
   d) optionally annealing,
   e) depositing and patterning a channel layer comprising zinc-indium oxide,
   f) optionally annealing,
   g) depositing and patterning a conductive source and conductive drain comprising indium-tin oxide (ITO), and
   h) depositing and patterning conductive contact pads electrically coupled to the metal gate, the conductive source, and the conductive drain respectively.

32. The method of claim 31, wherein the steps are performed in the order recited.

33. The method of claim 31, wherein the metal film adapted to be anodized comprises aluminum.

34. A thin-film transistor formed on a substrate, the thin-film transistor comprising:
   a) a metallic gate disposed on the substrate,
   b) a gate dielectric formed by anodization of the metallic gate and covering the metallic gate,
   c) a channel comprising a multi-cation oxide inorganic material disposed on at least a portion of the gate dielectric, and
   d) a conductive source and a conductive drain, both contiguous with the channel and spaced apart from each other.

35. The thin-film transistor of claim 34, wherein the substrate comprises a flexible film.

36. The thin-film transistor of claim 34, wherein the substrate is substantially transparent.

37. The thin-film transistor of claim 34, wherein the substrate comprises a polyimide.

38. The thin-film transistor of claim 34, wherein the multi-cation oxide comprises a mixed oxide of two or more cations of the groups 11, 12, 13, 14, and 15 of the periodic table.

39. The thin-film transistor of claim 34, wherein the multi-cation oxide comprises a mixed oxide including two or more cations selected from the list consisting of copper, silver, lead, germanium, antimony, gallium, cadmium, zinc, indium, tin, and combinations thereof.

40. The thin-film transistor of claim 34, wherein the multi-cation oxide comprises a mixed oxide including two or more cations selected from the list consisting of gallium, cadmium, zinc, indium, and tin.

41. The thin-film transistor of claim 34, wherein the multi-cation oxide comprises zinc-indium oxide.

42. The thin-film transistor of claim 41, wherein the zinc-indium oxide has an atomic ratio of zinc to indium between about 1:1 and about 1:8.

43. The thin-film transistor of claim 41, wherein the zinc-indium oxide has an atomic ratio of zinc to indium between about 1:2 and about 1:6.

44. The thin-film transistor of claim 41, wherein the zinc-indium oxide has an atomic ratio of zinc to indium of about 1:4.

45. The thin-film transistor of claim 34, wherein the multi-cation oxide is amorphous.

46. The thin-film transistor of claim 34, wherein the metallic gate comprises a metal selected from the list consisting of aluminum, tantalum, titanium, tungsten, and alloys thereof.

47. The thin-film transistor of claim 34, wherein the metallic gate comprises a metal selected from the list consisting of aluminum, tantalum, and alloys thereof.

48. The thin-film transistor of claim 34, wherein the metallic gate comprises aluminum.

49. The thin-film transistor of claim 34, wherein the gate dielectric comprises aluminum oxide.

50. The thin-film transistor of claim 34, wherein the gate dielectric comprises tantalum oxide.

51. The thin-film transistor of claim 34, wherein the conductive source comprises indium-tin oxide (ITO).

52. The thin-film transistor of claim 51, wherein the indium-tin oxide (ITO) of the conductive source is substantially transparent.

53. The thin-film transistor of claim 34, wherein the conductive drain comprises indium-tin oxide (ITO).

54. The thin-film transistor of claim 53, wherein the indium-tin oxide (ITO) of the conductive drain is substantially transparent.

55. The thin-film transistor of claim 34, wherein both the conductive source and conductive drain comprise substantially transparent indium-tin oxide (ITO).

56. An integrated circuit comprising the thin-film transistor of claim 34.

57. A display comprising the thin-film transistor of claim 34.

58. The thin-film transistor of claim 34, wherein each element and material thereof and their combination have the properties resulting from exposure to temperatures less than or equal to about 400 degrees C.

59. A thin-film transistor formed on a substrate, the thin-film transistor comprising:
   a) a metallic aluminum gate disposed on the substrate,
   b) an anodic aluminum oxide gate dielectric formed by anodization of the metallic aluminum gate and covering the metallic aluminum gate,
   c) a channel comprising a zinc-indium oxide inorganic material disposed on at least a portion of the anodic aluminum oxide gate dielectric, and
   d) a conductive source and a conductive drain of indium-tin oxide (ITO) spaced apart from each other and both disposed contiguous with the channel.

60. The thin-film transistor of claim 59, wherein the zinc-indium oxide inorganic material comprises a zinc-to-indium atomic ratio of about 1:4.

61. The thin-film transistor of claim 59, wherein the substrate comprises a flexible material.

62. The thin-film transistor of claim 61, wherein the flexible substrate material comprises a polyimide.

63. An integrated circuit comprising the thin-film transistor of claim 59.

64. A display comprising the thin-film transistor of claim 59.

65. The thin-film transistor of claim 59, wherein each element and material thereof and their combination have the properties resulting from exposure to temperatures less than or equal to about 400 degrees C.

66. A thin-film transistor formed on a substrate, the thin-film transistor comprising:
   a) conductive means for gating disposed on the substrate,
   b) dielectric means for covering and insulating the conductive means for gating, the dielectric means for covering and insulating being formed by anodization of the conductive means for gating,
   c) channel means for controllably conducting current carriers, the channel means for controllably conducting current carriers comprising a multi-cation-oxide inorganic material disposed on at least a portion of the dielectric means for covering and insulating, and
   d) conductive source and drain means for injecting and collecting current carriers respectively, the source and drain means for injecting and collecting current carriers being spaced apart from each other and both being disposed contiguous with the channel means for controllably conducting current carriers.

67. The thin-film transistor of claim 66, wherein each element and material thereof and their combination have the properties resulting from exposure to temperatures less than or equal to about 400 degrees C.

68. A method of using a multi-cation oxide, comprising the steps of:
   a) providing a substrate,
   b) depositing end patterning a metal gate,
   c) forming a gate dielectric on the metal gate by anodization of the metal gate,
   d) depositing and patterning the multi-cation oxide inorganic material over at least a portion of the gate dielectric to form a channel layer for a thin-film transistor, and
   e) depositing and patterning a conductive source and conductive drain spaced apart from each other and disposed in contact with the channel layer, whereby a thin-film transistor is fabricated.

69. A thin-film transistor formed on a substrate, the thin-film transistor comprising:
   a) means for gating disposed on the substrate,
   b) means for covering and insulating the means for gating, the means for covering and insulating being formed by anodization of the means for gating,
   c) means for controllably conducting current carriers, comprising a multi-cation-oxide inorganic material disposed on at least a portion of the means for covering and insulating, and
   d) means for injecting and means for collecting current carriers, the means for injecting and means for collecting current carriers being spaced apart from each other and both being disposed contiguous with the means for controllably conducting current carriers.

70. The thin-film transistor of claim 69, wherein each element and material thereof and their combination have the properties resulting from exposure to temperatures less than or equal to about 400 degrees C.

* * * * *

UNITED STATES PATENT AND TRADEMARK OFFICE
CERTIFICATE OF CORRECTION

PATENT NO. : 7,427,776 B2  Page 1 of 1
APPLICATION NO. : 10/961507
DATED : September 23, 2008
INVENTOR(S) : Randy Hoffman et al.

It is certified that error appears in the above-identified patent and that said Letters Patent is hereby corrected as shown below:

In column 1, line 16, after "processes" insert -- compatible --.

In column 2, line 21, after "needed" insert -- which have fewer --.

In column 8, line 66, in Claim 4, delete "patteming" and insert -- patterning --, therefor.

In column 9, line 20, in Claim 13, delete "muiti-cation" and insert -- multi-cation --, therefor.

In column 9, line 42, in Claim 20, delete "tram" and insert -- from --, therefor.

In column 9, line 59, in Claim 26, delete "claim 22." and insert -- claim 22, --, therefor.

In column 9, line 64, in Claim 27, delete "catians" and insert -- cations --, therefor.

In column 12, line 30, in Claim 68, delete "end" and insert -- and --, therefor.

Signed and Sealed this

Twenty-third Day of December, 2008

JON W. DUDAS
*Director of the United States Patent and Trademark Office*